(12) United States Patent
Xusheng et al.

(10) Patent No.: US 8,614,508 B2
(45) Date of Patent: Dec. 24, 2013

(54) INTEGRATED CIRCUIT SYSTEM WITH TEST PADS AND METHOD OF MANUFACTURE THEREOF

(75) Inventors: Bao Xusheng, Singapore (SG); Rui Huang, Singapore (SG)

(73) Assignee: STATS ChipPac Ltd., Singapore (SG)

( * ) Notice: Subject to any disclaimer, the term of this patent is extended or adjusted under 35 U.S.C. 154(b) by 35 days.

(21) Appl. No.: 13/239,373

(22) Filed: Sep. 21, 2011

(65) Prior Publication Data

US 2013/0069063 A1    Mar. 21, 2013

(51) Int. Cl.
*H01L 29/40* (2006.01)

(52) U.S. Cl.
USPC .......................................... 257/758; 257/459

(58) Field of Classification Search
USPC ............... 257/48, 459, 528, 532, E21.53, 257/E21.531, E21.499, E21.179, E23.179, 257/E23.733, E23.779; 438/460–465, 438/14–18, 652, 613
See application file for complete search history.

(56) References Cited

U.S. PATENT DOCUMENTS

| | | | |
|---|---|---|---|
| 6,762,499 B2 * | 7/2004 | Nakadaira | 257/758 |
| 6,878,963 B2 | 4/2005 | Fang | |
| 7,250,626 B2 | 7/2007 | Lesher | |
| 7,282,940 B2 | 10/2007 | Hirai | |
| 7,298,051 B2 * | 11/2007 | Saito | 257/784 |
| 7,616,020 B2 | 11/2009 | Kim et al. | |
| 7,901,956 B2 | 3/2011 | Kuan et al. | |
| 8,143,098 B2 * | 3/2012 | Do et al. | 438/108 |

* cited by examiner

*Primary Examiner* — Yu-Hsi D Sun
*Assistant Examiner* — Christina Sylvia
(74) *Attorney, Agent, or Firm* — Ishimaru & Associates LLP

(57) ABSTRACT

A method of manufacture of an integrated circuit system includes: providing a substrate having a test pad with element pads; forming a conductive layer over the test pad, the conductive layer having element layers directly on the element pads; and mounting an integrated circuit over the substrate.

20 Claims, 6 Drawing Sheets

INTEGRATED CIRCUIT SYSTEM WITH TEST PADS AND METHOD OF MANUFACTURE THEREOF

TECHNICAL FIELD

The present invention relates generally to an integrated circuit system, and more particularly to a system for an integrated circuit system with pads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

As package configurations are made smaller and thinner, manufacturers of electrical/electronic devices such as integrated circuits (ICs), including system-on-a-chip (SoC), radio frequency (RF) circuit devices, printed circuit boards, and other electronic circuits, typically use automatic test equipment (ATE), testers, or similar other test systems to test the devices during the production process. The test systems are generally configured to apply a test signal to the device under test (DUT) and measure its response to determine a pass or fail status.

The test systems typically include a tester equipped with a probe card having one or more probe pins or needles. The probe pins are generally aligned with corresponding bond pads on a wafer to make contact and test a respective die or an IC, which is the DUT. Bond pads are contacted by probes to test the electrical properties and functioning of the semiconductor package to determine whether the finished semiconductor package performs per specification.

Thus, a need still remains for an integrated circuit system providing reliability. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a substrate having a test pad with element pads; forming a conductive layer over the test pad, the conductive layer having element layers directly on the element pads; and mounting an integrated circuit over the substrate.

The present invention provides an integrated circuit system, including: a substrate having a test pad with element pads; a conductive layer over the test pad, the conductive layer having element layers directly on the element pads; and an integrated circuit over the substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
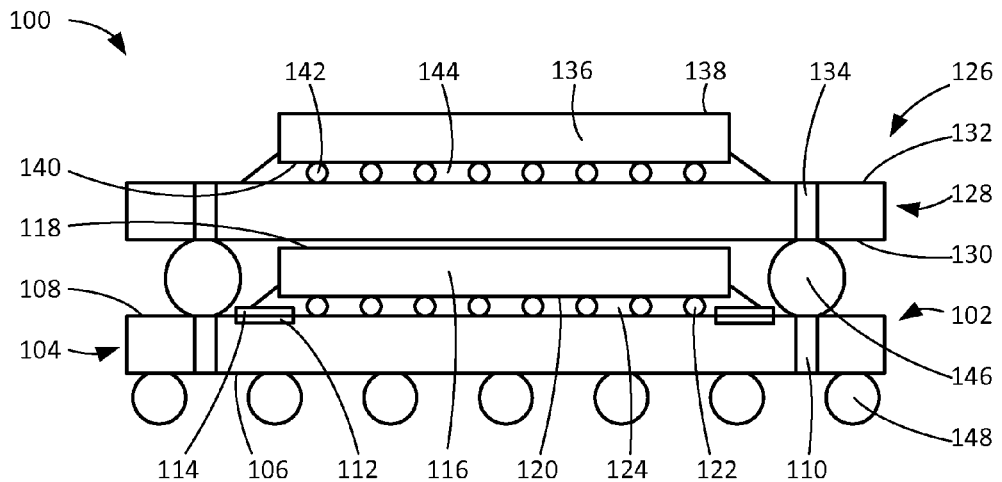
FIG. 1 is a cross-sectional view of an integrated circuit system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

After solder cap reflow, a solder cap on a probe or test pad tends to shrink under a surface tension effect due to a large aspect ratio (i.e. ratio of diameter to height) of the solder cap resulting in problems of a portion of the probe or test pad exposed and oxidized in a subsequent process. As a result, probing on a bottom package cannot be done. Embodiments of the present invention provide answers or solutions to the problems.

Figure 2:
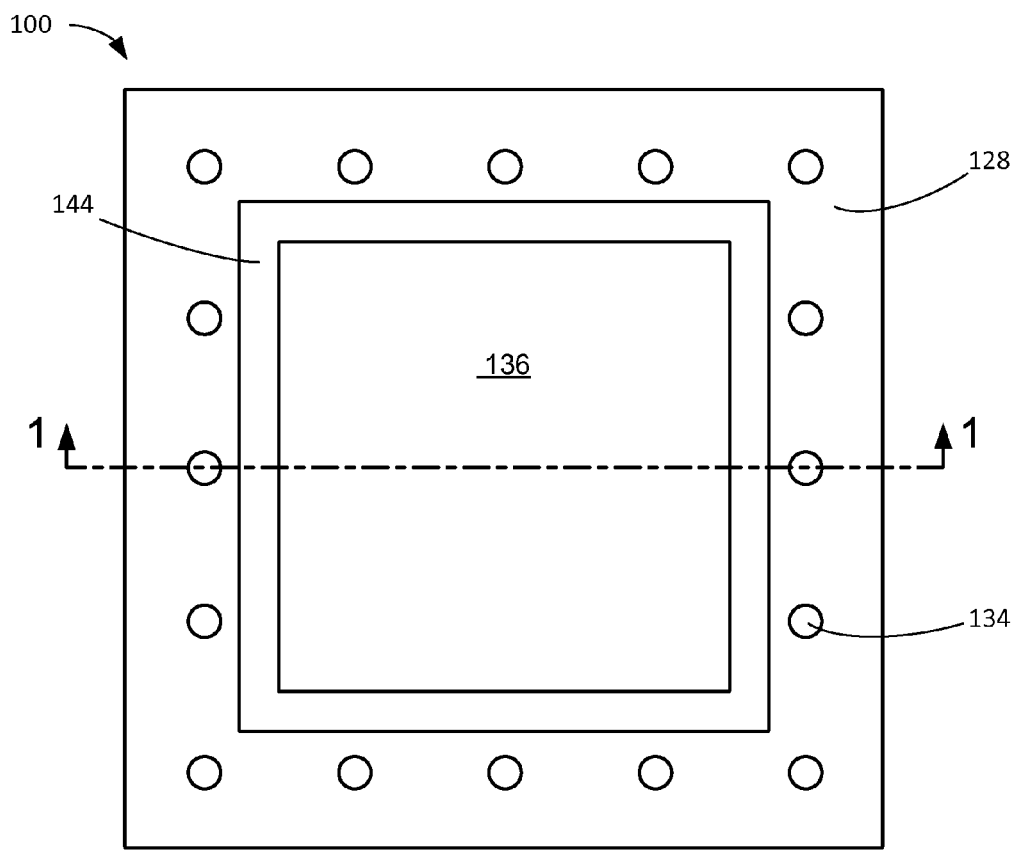
FIG. 2 is a top view of the integrated circuit system.

Referring now to FIG. 1, therein is shown a cross-sectional view of an integrated circuit system 100 taken along line 1-1 of FIG. 2 in a first embodiment of the present invention. The integrated circuit system 100 can include a structure of a package-on-package (PoP) with through silicon via (TSV) substrate. The integrated circuit system 100 can include a probe pad design.

The integrated circuit system 100 can include a bottom package 102, which is defined as an integrated circuit package. The bottom package 102 can include a bottom substrate 104 having a bottom substrate connection side 106 and a bottom substrate attachment side 108 opposite the bottom substrate connection side 106.

The bottom substrate 104 is defined as a support structure for mounting and connecting an integrated circuit thereto including providing electrical connections through the support structure. The bottom substrate 104 can represent a support structure including through silicon via (TSV) substrate and a silicon (Si) interposer with TSV.

The bottom substrate 104 can include bottom substrate vias 110, which are defined as electrical conductors. The bottom substrate vias 110 can be formed by filling a conductive material within holes with the holes through the bottom substrate 104. The bottom substrate vias 110 can extend from the bottom substrate connection side 106 to the bottom substrate attachment side 108. The bottom substrate vias 110 can be formed in any number of rows. For example, the bottom substrate vias 110 can represent through silicon vias (TSV).

The bottom substrate 104 can include test pads 112, which are defined as contacts having separate portions and providing electrical connectivity between the bottom substrate 104 and an external system (not shown) for testing purposes. The test pads 112 can be formed at the bottom substrate attachment side 108. Portions of the test pads 112 can be exposed at the bottom substrate attachment side 108. The test pads 112 can represent probe pads for testing a device under test (DUT) during a production process.

The bottom package 102 can include conductive layers 114, which are defined as structures of an electrically conductive material. The conductive layers 114 can be formed directly on the test pads 112 providing environment protections from oxidation. The conductive layers 114 can be formed directly on portions of the test pads 112 with the portions exposed at the bottom substrate attachment side 108.

The conductive layers 114 can be formed by any application method including stencil printing. For example, the conductive layers 114 can be formed with solder, a metallic material, and a metal alloy for preventing oxidation. Also for example, the conductive layers 114 can represent solder caps.

The bottom package 102 can include a bottom integrated circuit 116 having a bottom integrated circuit inactive side 118 and a bottom integrated circuit active side 120 opposite the bottom integrated circuit inactive side 118. The bottom integrated circuit 116 is defined as an integrated circuit device having a number of integrated transistors interconnected to form active circuits fabricated thereon. The bottom integrated circuit 116 can be mounted over the bottom substrate 104 with the bottom integrated circuit active side 120 facing the bottom substrate attachment side 108.

The bottom integrated circuit 116 can include bottom integrated circuit connectors 122, which are defined as electrically conductive connectors for connecting the bottom integrated circuit 116 to the bottom substrate 104. The bottom integrated circuit connectors 122 can be attached to the bottom integrated circuit active side 120 and the bottom substrate attachment side 108. The bottom integrated circuit connectors 122 can be surrounded by the test pads 112. The bottom integrated circuit connectors 122 can represent micro bumps.

The bottom package 102 can include a bottom underfill 124, which is defined as a layer of material for providing protection to the bottom integrated circuit connectors 122. The bottom underfill 124 can be formed with the layer of material including an epoxy resin or any underfill (UF) resin material.

The bottom underfill 124 can be formed directly on the bottom integrated circuit connectors 122. The bottom underfill 124 can be filled between the bottom integrated circuit active side 120 and the bottom substrate attachment side 108.

The integrated circuit system 100 can include a top package 126, which is defined as an integrated circuit package. The top package 126 can include a top substrate 128 having a top substrate connection side 130 and a top substrate attachment side 132 opposite the top substrate connection side 130.

The top substrate 128 is defined as a support structure for mounting and connecting an integrated circuit thereto including providing electrical connections through the support structure. The top substrate 128 can represent a support structure including through silicon via (TSV) substrate and a silicon (Si) interposer with TSV.

The top substrate 128 can include top substrate vias 134, which are defined as electrical conductors. The top substrate vias 134 can be formed by filling a conductive material within holes with the holes through the top substrate 128. The top substrate vias 134 can extend from the top substrate connection side 130 to the top substrate attachment side 132. The top substrate vias 134 can be formed in any number of rows. For example, the top substrate vias 134 can represent through silicon vias (TSV).

The top package 126 can include a top integrated circuit 136 having a top integrated circuit inactive side 138 and a top integrated circuit active side 140 opposite the top integrated circuit inactive side 138. The top integrated circuit 136 is defined as an integrated circuit device having a number of integrated transistors interconnected to form active circuits fabricated thereon. The top integrated circuit 136 can be mounted over the top substrate 128 with the top integrated circuit active side 140 facing the top substrate attachment side 132.

The top integrated circuit 136 can include top integrated circuit connectors 142, which are defined as electrically conductive connectors for connecting the top integrated circuit 136 to the top substrate 128. The top integrated circuit connectors 142 can be attached to the top integrated circuit active side 140 and the top substrate attachment side 132. The top integrated circuit connectors 142 can represent micro bumps.

The top package 126 can include a top underfill 144, which is defined as a layer of material for providing protection to the top integrated circuit connectors 142. The top underfill 144 can be formed with the layer of material including an epoxy resin or any underfill (UF) resin material.

The top underfill 144 can be formed directly on the top integrated circuit connectors 142. The top underfill 144 can be filled between the top integrated circuit active side 140 and the top substrate attachment side 132.

The integrated circuit system 100 can include package-package connectors 146, which are defined as electrically conductive connectors providing inter-package connections or package-to-package interconnections. The top package 126 can be mounted over the bottom package 102 with the package-package connectors 146 attached to the bottom substrate attachment side 108 and the top substrate connection side 130.

The package-package connectors 146 can be electrically connected and attached to the bottom substrate vias 110 and the top substrate vias 134. The package-package connectors 146 can surround the bottom integrated circuit 116.

The integrated circuit system 100 can include system connectors 148, which are defined as electrically conductive connectors providing system-level interconnections. The system connectors 148 can be attached to the bottom substrate connection side 106 for providing electrical connectivity to an external system (not shown).

The bottom substrate vias 110, the test pads 112, and the top substrate vias 134 can be formed with a conductive material including a metallic material. For example, the bottom substrate vias 110, the test pads 112, and the top substrate vias 134 can be formed with copper or any other electrically conductive material.

For illustration purposes, the bottom substrate 104 is shown with the test pads 112, although it is understood that other components can be formed with the test pads 112. For example, the test pads 112 can be formed on an active area of an integrated circuit die for an open/short (O/S) test or a functional test. Also for example, the test pads 112 can be electrically coupled to a functional circuit on a substrate or an integrated circuit (IC) attached to a substrate.

Also for example, the test pads 112 on the active area of the integrated circuit die can be different from probe pads on or along a saw street lane or a scribe line, which is for a process control module (PCM) test. Further, for example, the top substrate 128 can be formed with the test pads 112.

For illustration purpose, the integrated circuit system 100 is shown having a silicon substrate, such as the bottom substrate 104 with the bottom substrate vias 110 and the test pads 112, although it is understood that the integrated circuit system 100 can also be applicable to any systems with probe test pads. For example, the integrated circuit system 100 can include the test pads 112 in designs of integrated circuits, integrated passive devices, printed circuit boards (PCB), and any packages where protection from pad oxidation is desired.

For illustration purposes, only the bottom substrate 104 is shown with the test pads 112 and the conductive layers 114, although it is understood that the top substrate 128 can include additional test pads (not shown) with additional conductive layers (not shown) formed thereon. For example, the additional test pads can be formed at the top substrate attachment side 132 and the additional conductive layers can be formed directly on the additional test pads.

Referring now to FIG. 2, therein is shown a top view of the integrated circuit system 100. The top view depicts the top integrated circuit 136 at an interior portion of the top substrate 128 with the top substrate vias 134 surrounding the top integrated circuit 136. The top underfill 144 can be between the top integrated circuit 136 and the top substrate 128.

Figure 3:
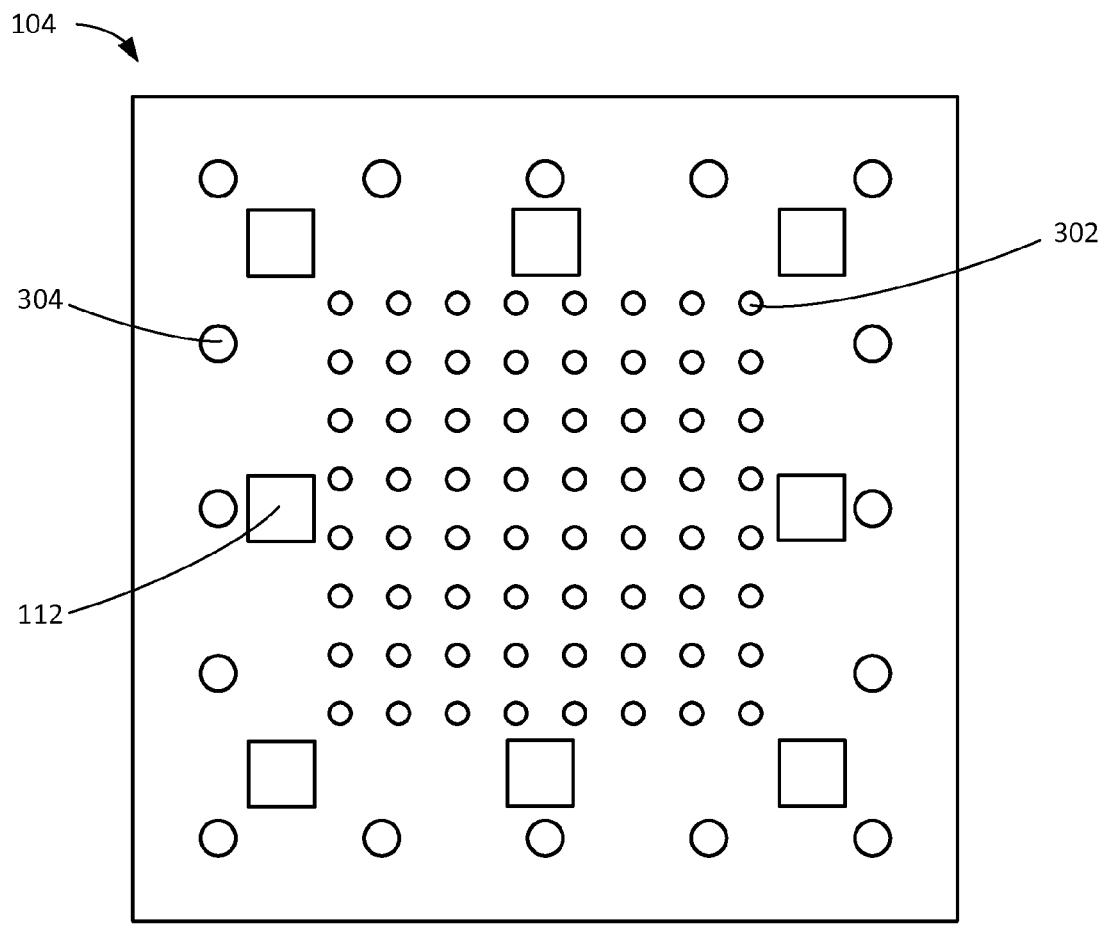
FIG. 3 is a top view of the bottom substrate.

Referring now to FIG. 3, therein is shown a top view of the bottom substrate 104. The bottom substrate 104 can include bottom substrate pads 302, which are defined as contacts for attaching and electrically connecting the bottom integrated circuit 116 of FIG. 1 to the bottom substrate 104. An area array of the bottom substrate pads 302 can be surrounded by rows of the test pads 112. The bottom substrate pads 302 can represent bump pads for attaching micro bumps directly thereon.

The bottom substrate vias 110 of FIG. 1 can include attachment pads 304, which are defined as contacts for attaching and electrically connecting the package-package connectors 146 of FIG. 1 to the bottom substrate vias 110. Rows of the attachment pads 304 can be formed along a periphery of the bottom substrate 104 and surrounding the test pads 112. The attachment pads 304 can represent bump pads for inter-package connections.

The bottom substrate pads 302 and the attachment pads 304 can be formed with a conductive material including a metallic material. For example, the bottom substrate pads 302 and the attachment pads 304 can be formed with copper or any other electrically conductive material.

For illustration purposes, the bottom substrate pads 302 and the attachment pads 304 are shown having circular shapes, although it is understood that the bottom substrate pads 302 and the attachment pads 304 can include any other shapes. For example, the bottom substrate pads 302 and the attachment pads 304 can include rectangular shapes.

Each of the test pads 112 can include a planar area greater than a planar area of each of the attachment pads 304. Each of the attachment pads 304 can include a planar area greater than a planar area of each of the bottom substrate pads 302.

For illustration purposes, the test pads 112 are shown surrounding the area array of the bottom substrate pads 302, although it is understood that the test pads 112 can be formed at other portions of the bottom substrate 104. For example, the test pads 112 can be formed at an interior portion of the bottom substrate 104 such that at least one of the test pads 112 can be surrounded by the bottom substrate pads 302.

For illustration purposes, each of the test pads 112 is shown having a planar area approximately equal to four times a planar area of one of the attachment pads 304, although it is understood that each of the test pads 112 can include any planar areas relative to a planar area of one of the attachment pads 304. For example, each of the test pads 112 can include a planar area approximately equal to nine times a planar area of one of the attachment pads 304.

The conductive layers 114 of FIG. 1 can be formed directly on the test pads 112 in order to prevent surface oxidation during a package assembly process with temperature excursion. The package assembly process can include attachment of the bottom integrated circuit 116, reflow of the bottom integrated circuit connectors 122 of FIG. 1, and reflow of the package-package connectors 146.

The integrated circuit system 100 of FIG. 1 can include additional conductive layers (not shown) directly on the attachment pads 304 in order to prevent surface oxidation during the package assembly process with temperature excursion. The additional conductive layers can be formed for inter-package connections to attach and electrically connect the package-package connectors 146 to the attachment pads 304.

Figure 4:
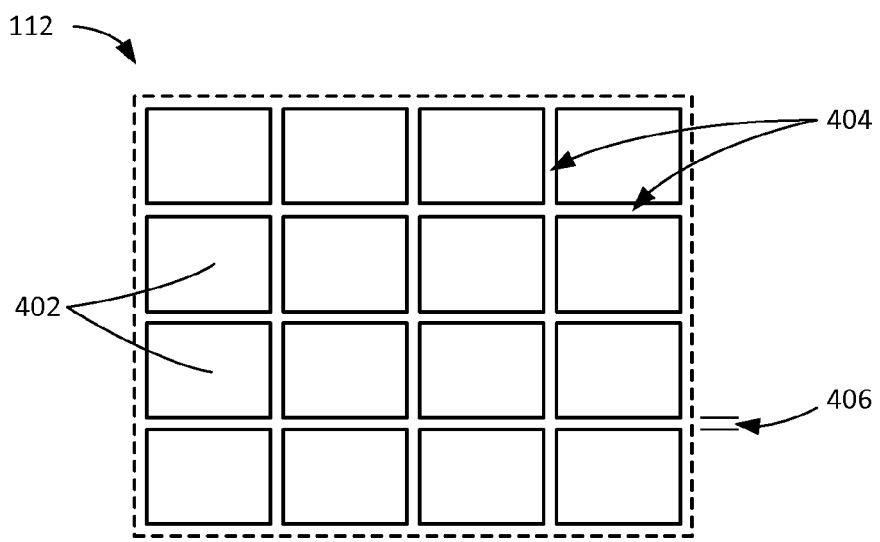
FIG. 4 is a detailed top view of one of the test pads.

Referring now to FIG. 4, therein is shown a detailed top view of one of the test pads 112. Each of the test pads 112 can include a plurality of element pads 402, which are defined as portions of each of the test pads 112 that are physically and electrically separate from each other. The integrated circuit system 100 of FIG. 1 can be differentiated from other integrated circuit systems by a different package structure with the element pads 402.

For illustration purposes, the element pads 402 are shown in an area array of four of the element pads 402 by four of the element pads 402, although it is understood that the element pads 402 can be formed in any array sizes or any number of the element pads 402. The area array is defined as a structural arrangement of multiple rows of the element pads 402, which are approximately equally spaced from each other in each of the rows. A number and shapes of the element pads 402 can be selected or predetermined appropriately such that the conductive layers 114 of FIG. 1 can be formed to bridge the element pads 402 that are adjacent each other and a predetermined height of the conductive layers 114 can be achieved.

For illustration purposes, the element pads 402 are shown with rectangular shapes, although it is understood that the element pads 402 can include any shapes. For example, the element pads 402 can include shapes of a circle, a triangle, and an oval.

Each of the test pads 112 can include gaps 404, which are defined as spacing between the element pads 402 adjacent each other and there is no conductive material in the spacing. As a specific example, the gaps 404 can represent copper free areas of the test pads 112.

Each of the gaps 404 can include a gap width 406, which is defined as a distance from an edge of one of the element pads 402 to an edge of another of the element pads 402 that is adjacent the one of the element pads 402. The gap width 406 can include an approximate range of 1 micrometer (um) to 10 um so that the element pads 402 can be very close to each other.

For illustration purposes, the test pads 112 are shown having the element pads 402, although it is understood that other pads can also be formed with the element pads 402. For example, large interconnection pads for inter-package interconnection, such as the attachment pads 304 of FIG. 3, can also be formed with the element pads 402. For a specific example, any pads can be formed with the element pads 402 where super thin solder paste is formed directly thereon.

It has been discovered that new improved design of the test pads 112 having the element pads 402 provides improved reliability since the conductive layers 114 are formed directly on and cover upper surfaces of the element pads 402 to provide protection to the element pads 402 thereby eliminating oxidation in package assembly process with temperature excursion.

It has also been discovered that the element pads 402 having the gaps 404 solves the root cause of the problem of exposed pad issues at the initial point and ease the process control printing coverage since it is not clear how the printing coverage is controlled.

It has further been discovered that the test pads 112 provide reduced horizontal profile without additional silicon area to ensure proper probing because a planar surface area of each of the test pads 112 is smaller than a planar surface area of a conventional test pad, shown with a dash rectangle, since a boundary of each of the test pads 112 is within an original boundary of a conventional test pad.

Figure 5:
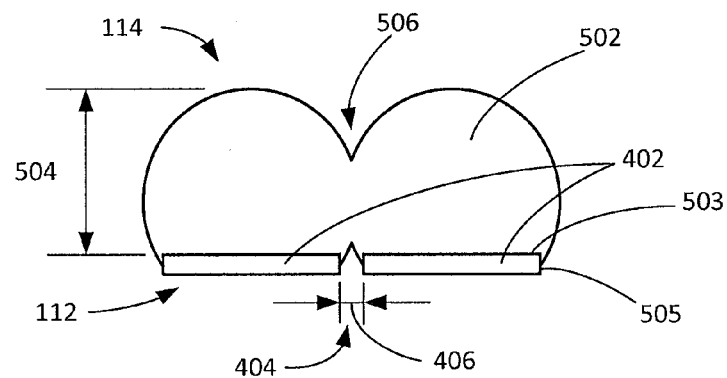
FIG. 5 is a cross-sectional view of portions of one of the test pads and one of the conductive layers.

Referring now to FIG. 5, therein is shown a cross-sectional view of portions of one of the test pads 112 and one of the conductive layers 114. The cross-sectional view depicts two of the element pads 402.

Each of the conductive layers 114 can include element layers 502, which are defined as portions of each of the conductive layers 114. One of the element layers 502 is formed directly on one of the element pads 402. The element layers 502 can include curve surfaces due to surface tension. The element pads 402 include top surfaces 503 and non-horizontal surfaces 505 intersecting the top surfaces 503. The element layers 502 are directly on the top surfaces 503 and portions of the non-horizontal surfaces 505.

Each of the element layers 502 can include an element layer height 504, which is defined as a vertical distance from a bottom side of each of the element layers 502 to a top side of each of the element layers 502. The element layer height 504 can include an approximate range of greater than 0 um and less than or equal to 50 um. For example, the conductive layers 114 can represent thin solder caps since the element layer height 504 can be less than or approximately equal to 50 um.

Each of the conductive layers 114 can include bridges 506, which are defined as portions of each of the conductive layers 114 that connect one of the element layers 502 to another of the element layers 502. The bridges 506 can be formed as a combination of a portion of one of the element layers 502 and a portion of another of the element layers 502.

The element layers 502 that are adjacent each other can be connected to each other forming the bridges 506 such that all of the element layers 502 can be electrically interconnected.

The bridges 506 can be formed directly over the gaps 404. Each of the bridges 506 can include a horizontal width approximately equal to the gap width 406. For example, the bridges 506 can represent solder bridges. Also for example, the bridges 506 can be formed after a stencil printing and solder cap reflow occur.

It has been discovered that the conductive layers 114 having the element layers 502 provide improved reliability since the element layers 502 fully cover all of the element pads 402 thereby eliminating oxidation problems and thus resulting in reliable probing and testing without requiring additional masks nor modification of manufacturing processes but instead with only layout change of the test pads 112.

It has also been discovered that each of the element layers 502 having the element layer height 504 provides further improved reliability such that the element layers 502 have sufficient thicknesses to completely cover and thus protect the element pads 402, thereby eliminating copper surface oxidation and probe card damage on the test pads 112, so that probing on the bottom package 102 of FIG. 1 or the top package 126 of FIG. 1 is properly done to ensure known good bottom packages before package stacking occurs.

It has further been discovered that the conductive layers 114 having the bridges 506 provide improved structural integrity with the bridges 506 attaching all of the element layers 502 together in each of the conductive layers 114 resulting in a rigid structure having multiple of the element layers 502.

Figure 6:
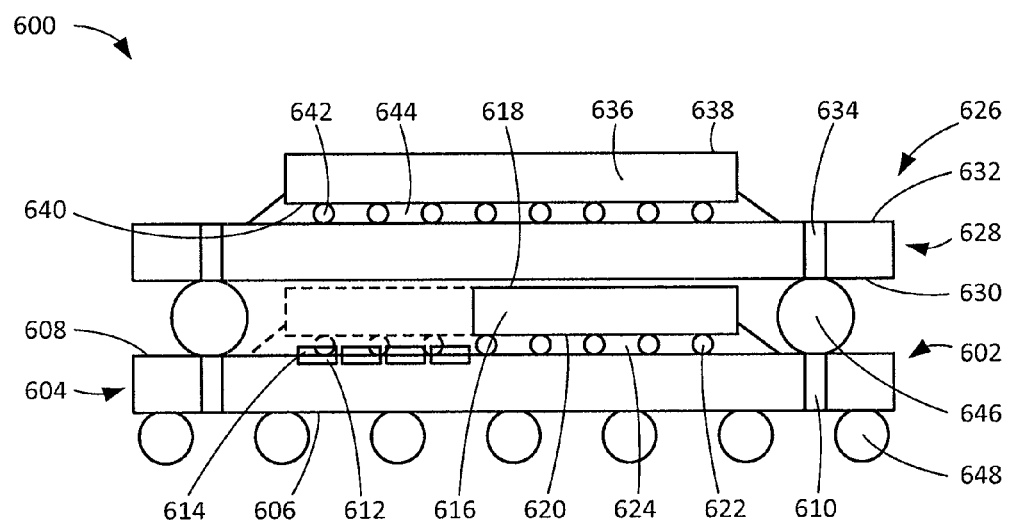
FIG. 6 is a cross-sectional view of an integrated circuit system taken along line 6-6 of FIG. 7 in a second embodiment of the present invention.
Figure 7:
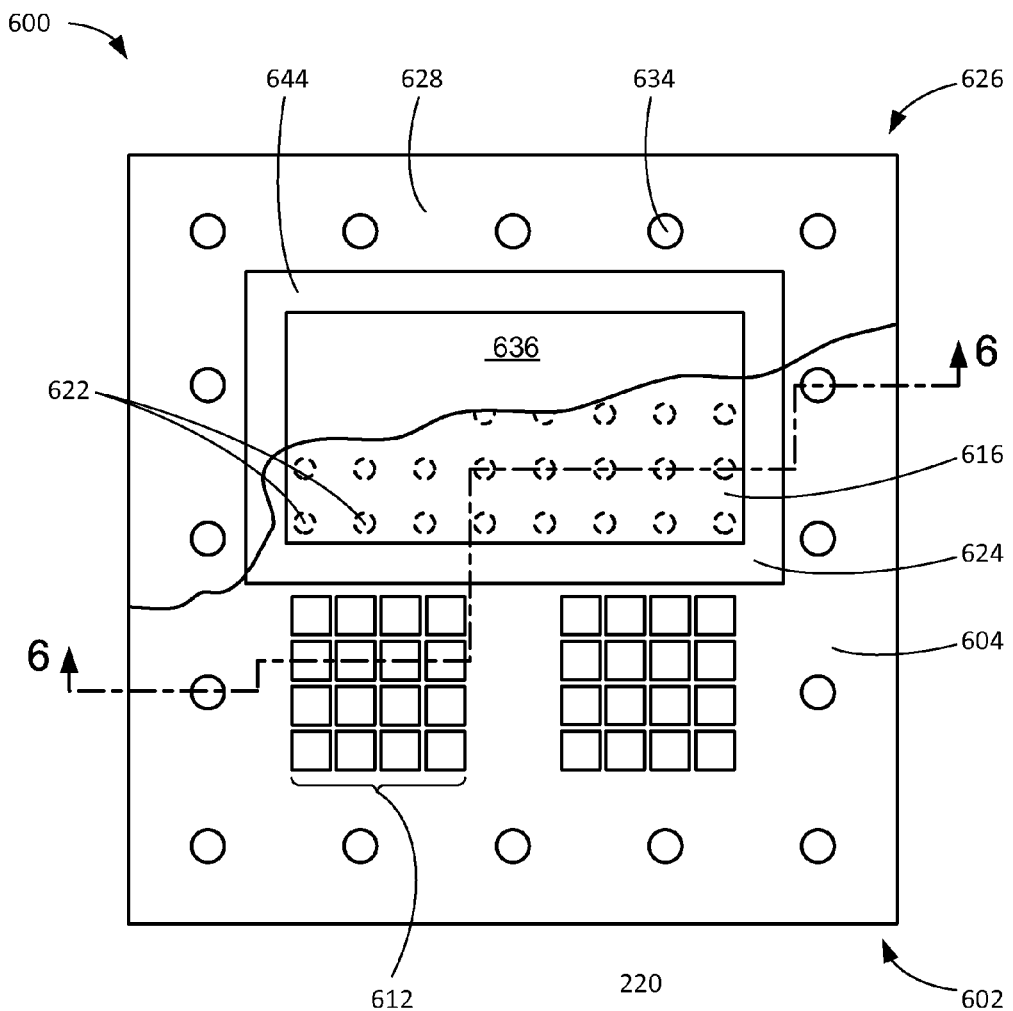
FIG. 7 is a top view of the integrated circuit system.

Referring now to FIG. 6, therein is shown a cross-sectional view of an integrated circuit system 600 taken along line 6-6 of FIG. 7 in a second embodiment of the present invention. The integrated circuit system 600 can include a bottom package 602, which is defined as an integrated circuit package. The bottom package 602 can include a bottom substrate 604 having a bottom substrate connection side 606 and a bottom substrate attachment side 608 opposite the bottom substrate connection side 606.

The bottom substrate 604 is defined as a support structure for mounting and connecting an integrated circuit thereto including providing electrical connections through the support structure. The bottom substrate 604 can represent a support structure including through silicon via (TSV) substrate and a silicon (Si) interposer with TSV.

The bottom substrate 604 can include bottom substrate vias 610, which are defined as electrical conductors. The bottom substrate vias 610 can be formed by filling a conductive material within holes with the holes through the bottom substrate 604. The bottom substrate vias 610 can extend from the bottom substrate connection side 606 to the bottom substrate attachment side 608. The bottom substrate vias 610 can be formed in any number of rows. For example, the bottom substrate vias 610 can represent through silicon vias (TSV).

The bottom substrate 604 can include test pads 612, which are defined as contacts having separate portions and providing electrical connectivity between the bottom substrate 104 and an external system (not shown) for testing purposes. The test pads 612 can be formed at the bottom substrate attachment side 608. Portions of the test pads 612 can be exposed at the bottom substrate attachment side 608. The test pads 612 can represent probe or test pads.

The bottom package 602 can include conductive layers 614, which are defined as structures of an electrically conductive material. The conductive layers 614 can be formed directly on the test pads 612 providing environment protections from oxidation. The conductive layers 614 can be formed directly on portions of the test pads 612 with the portions exposed at the bottom substrate attachment side 608.

The conductive layers 614 can be formed with an electrically conductive material. The conductive layers 614 can be formed by any application method including stencil printing. For example, the conductive layers 614 can be formed with solder, a metallic material, and a metal alloy for preventing oxidation. Also for example, the conductive layers 614 can represent solder caps.

The bottom package 602 can include a bottom integrated circuit 616 having a bottom integrated circuit inactive side 618 and a bottom integrated circuit active side 620 opposite the bottom integrated circuit inactive side 618. The bottom integrated circuit 616 is defined as an integrated circuit device having a number of integrated transistors interconnected to form active circuits fabricated thereon.

The bottom integrated circuit 616 can be mounted over the bottom substrate 604 with the bottom integrated circuit active side 620 facing the bottom substrate attachment side 608. For illustration purposes, only the right portion of the bottom integrated circuit 616 is shown when the cross-sectional view is taken along the line 6-6 of FIG. 7, although it is understood that the bottom integrated circuit 616 also includes the left portion, shown with a dash rectangle.

It is understood that the size or dimension of the bottom integrated circuit 616 does not have to be reduced to provide spacing for more of the test pads 612. Each of the test pads 612 includes small pads, such as the element pads 402 of FIG. 4, instead of increasing a pad area of each of the test pads 612.

The bottom integrated circuit 616 can include bottom integrated circuit connectors 622, which are defined as electrically conductive connectors for connecting the bottom integrated circuit 616 to the bottom substrate 604. The bottom integrated circuit connectors 622 can be attached to the bottom integrated circuit active side 620 and the bottom substrate attachment side 608. The bottom integrated circuit connectors 622 can be adjacent the test pads 612. The bottom integrated circuit connectors 622 can represent micro bumps.

The bottom package 602 can include a bottom underfill 624, which is defined as a layer of material for providing protection to the bottom integrated circuit connectors 622. The bottom underfill 624 can be formed with the layer of material including an epoxy resin or any underfill (UF) resin material.

The bottom underfill 624 can be formed directly on the bottom integrated circuit connectors 622. The bottom underfill 624 can be filled between the bottom integrated circuit active side 620 and the bottom substrate attachment side 608.

The integrated circuit system 600 can include a top package 626, which is defined as an integrated circuit package. The top package 626 can include a top substrate 628 having a top substrate connection side 630 and a top substrate attachment side 632 opposite the top substrate connection side 630.

The top substrate 628 is defined as a support structure for mounting and connecting an integrated circuit thereto including providing electrical connections through the support structure. The top substrate 628 can represent a support structure including through silicon via (TSV) substrate and a silicon (Si) interposer with TSV.

The top substrate 628 can include top substrate vias 634, which are defined as electrical conductors. The top substrate vias 634 can be formed by filling a conductive material within holes with the holes through the top substrate 628. The top substrate vias 634 can extend from the top substrate connection side 630 and the top substrate attachment side 632. The top substrate vias 634 can be formed in any number of rows. For example, the top substrate vias 634 can represent through silicon vias (TSV).

The top package 626 can include a top integrated circuit 636 having a top integrated circuit inactive side 638 and a top integrated circuit active side 640 opposite the top integrated circuit inactive side 638. The top integrated circuit 636 is defined as an integrated circuit device having a number of integrated transistors interconnected to form active circuits fabricated thereon. The top integrated circuit 636 can be mounted over the top substrate 628 with the top integrated circuit active side 640 facing the top substrate attachment side 632.

The top integrated circuit 636 can include top integrated circuit connectors 642, which are defined as electrically conductive connectors for connecting the top integrated circuit 636 to the top substrate 628. The top integrated circuit connectors 642 can be attached to the top integrated circuit active side 640 and the top substrate attachment side 632. The top integrated circuit connectors 642 can represent micro bumps.

The top package 626 can include a top underfill 644, which is defined as a layer of material for providing protection to the top integrated circuit connectors 642. The top underfill 644 can be formed with the layer of material including an epoxy resin or any underfill (UF) resin material.

The top underfill 644 can be formed directly on the top integrated circuit connectors 642. The top underfill 644 can be filled between the top integrated circuit active side 640 and the top substrate attachment side 632.

The integrated circuit system 600 can include package-package connectors 646, which are defined as electrically conductive connectors providing inter-package connections or package-to-package interconnections. The top package 626 can be mounted over the bottom package 602 with the package-package connectors 646 attached to the bottom substrate attachment side 608 and the top substrate connection side 630.

The package-package connectors 646 can be electrically connected and attached to the bottom substrate vias 610 and the top substrate vias 634. The package-package connectors 646 can surround the bottom integrated circuit 616.

The integrated circuit system 600 can include system connectors 648, which are defined as electrically conductive connectors providing system-level interconnections. The system connectors 648 can be attached to the bottom substrate connection side 606 for providing electrical connectivity to an external system (not shown).

The bottom substrate vias 610, the test pads 612, and the top substrate vias 634 can be formed with a conductive material including a metallic material. For example, the bottom substrate vias 610, the test pads 612, and the top substrate vias 634 can be formed with copper or any other electrically conductive material.

For illustration purposes, the bottom substrate 604 is shown with the test pads 612, although it is understood that other components can be formed with the test pads 612. For example, the test pads 612 can be formed on an active area of an integrated circuit die for an open/short (O/S) test or a functional test. Also for example, the test pads 612 can be electrically coupled to a functional circuit on a substrate or an integrated circuit (IC) attached to a substrate. Further, for example, the test pads 612 on the active area of the integrated circuit die can be different from those on or along a saw street lane or a scribe line, which is for test of process control module (PCM).

Although the integrated circuit system 600 is shown having a silicon substrate with TSV and the test pads 612, such as the bottom substrate 604, it is understood that the integrated circuit system 600 can also be applicable to any systems with probe test pads. For example, the integrated circuit system 600 can include the test pads 612 in designs of integrated circuits, integrated passive devices, printed circuit boards (PCB), and any packages where protection from pad oxidation is desired.

Although only the bottom substrate 604 is shown with the test pads 612 and the conductive layers 614, although it is understood that the top substrate 628 can include additional test pads (not shown) with additional conductive layers (not shown) formed thereon. For example, the additional test pads can be formed at the top substrate attachment side 632 and the additional conductive layers can be formed directly on the additional test pads.

Referring now to FIG. 7, therein is shown a top view of the integrated circuit system 600. The top view depicts the top integrated circuit 636 at an interior portion of the top substrate 628 with the top substrate vias 634 surrounding the top integrated circuit 636. The top underfill 644 can be between the top integrated circuit 636 and the top substrate 628.

For illustration purposes, a portion of the top package 626 is not shown to show a portion of the bottom package 602. The bottom package 602 can include the test pads 612 adjacent a periphery side of the bottom integrated circuit 616 with the bottom integrated circuit connectors 622, shown as dash circles. The bottom underfill 624 can be between the bottom integrated circuit 616 and the bottom substrate 604.

Figure 8:
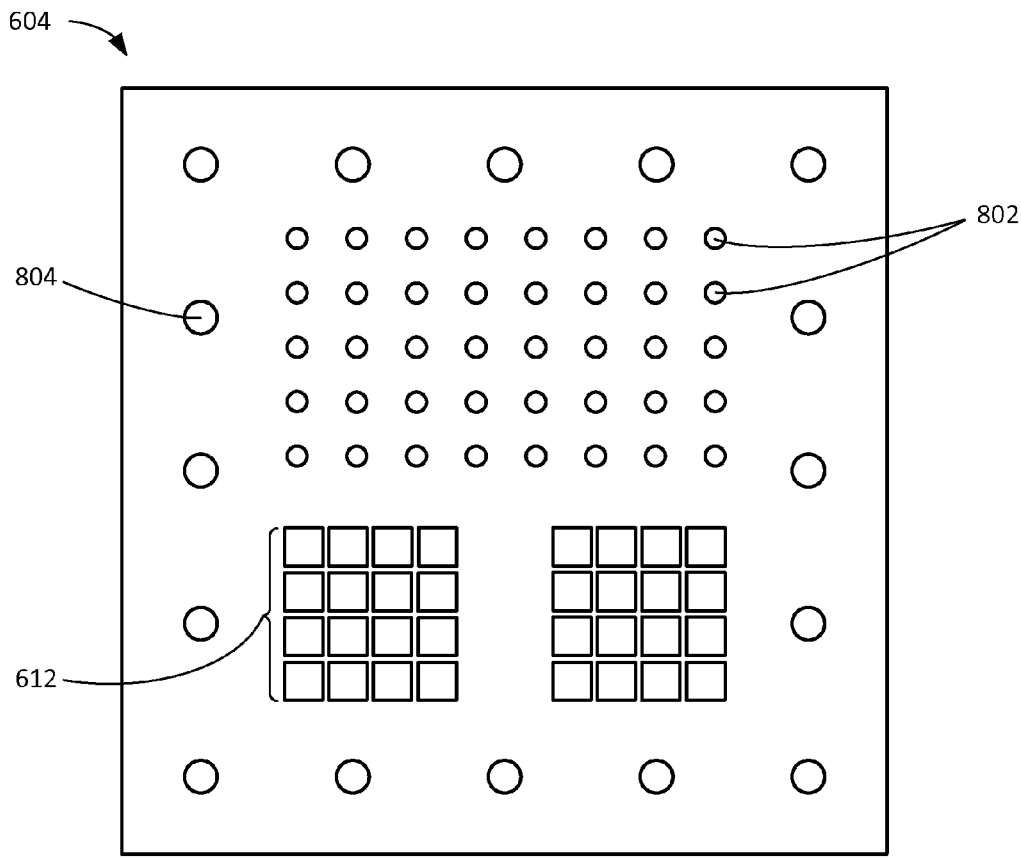
FIG. 8 is a top view of the bottom substrate.

Referring now to FIG. 8, therein is shown a top view of the bottom substrate 604. The bottom substrate 604 can include bottom substrate pads 802, which are defined as contacts for attaching and electrically connecting the bottom integrated circuit 616 of FIG. 6 to the bottom substrate 604. The bottom substrate pads 802 can represent bump pads for attaching micro bumps directly thereon.

The bottom substrate vias 610 of FIG. 6 can include attachment pads 804, which are defined as contacts for attaching and electrically connecting the package-package connectors 646 of FIG. 6 to the bottom substrate vias 610. Rows of the attachment pads 804 can be formed along a periphery of the bottom substrate 604 and surrounding the test pads 612. For illustration purposes, three rows of the attachment pads 804 and one row of the test pads 612 are shown surrounding an area array of the bottom substrate pads 802. The attachment pads 804 can represent bump pads for inter-package connections.

The bottom substrate pads 802 and the attachment pads 804 can be formed with a conductive material including a metallic material. For example, the bottom substrate pads 802 and the attachment pads 804 can be formed with copper or any other electrically conductive material.

For illustration purposes, the bottom substrate pads 802 and the attachment pads 804 are shown having circular shapes, although it is understood that the bottom substrate pads 802 and the attachment pads 804 can include any other shapes. For example, the bottom substrate pads 802 and the attachment pads 804 can include rectangular shapes.

Each of the test pads 612 can include a planar area greater than a planar area of each of the attachment pads 804. Each of the attachment pads 804 can include a planar area greater than a planar area of each of the bottom substrate pads 802.

For illustration purposes, the test pads 612 are shown adjacent a periphery side of the area array of the bottom substrate pads 802, although it is understood that the test pads 612 can be formed at other portions of the bottom substrate 604. For example, the test pads 612 can be formed at an interior portion of the bottom substrate 604 such that at least one of the test pads 612 can be surrounded by the bottom substrate pads 802.

The conductive layers 614 of FIG. 6 can be formed directly on the test pads 612 in order to prevent surface oxidation during a package assembly process with temperature excursion. The package assembly process can include attachment of the bottom integrated circuit 616, reflow of the bottom integrated circuit connectors 622 of FIG. 6, and reflow of the package-package connectors 646.

The integrated circuit system 600 of FIG. 6 can include additional conductive layers (not shown) directly on the attachment pads 804 in order to prevent surface oxidation during the package assembly process with temperature excursion. The additional conductive layers can be formed for inter-package connections to attach and electrically connect the package-package connectors 646 to the attachment pads 804.

Figure 9:
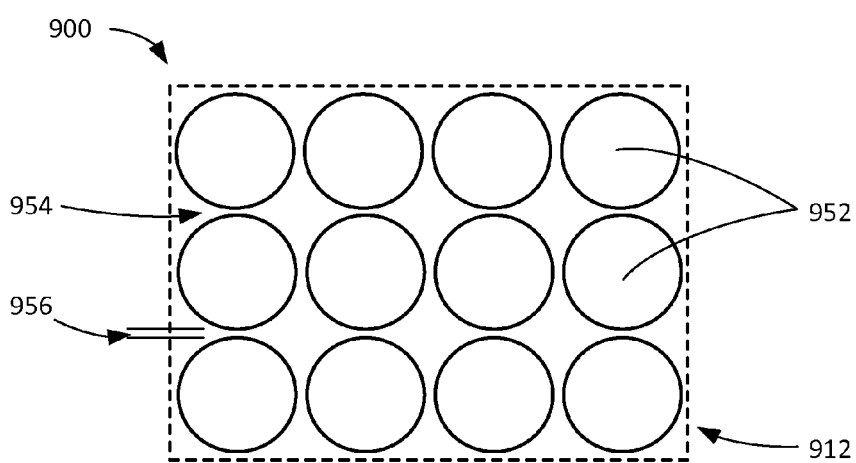
FIG. 9 is a top plan view of a portion of an integrated circuit system in a third embodiment of the present invention.

Referring now to FIG. 9, therein is shown a top plan view of a portion of an integrated circuit system 900 in a third embodiment of the present invention. In a manner similar to the integrated circuit system 100 of FIG. 1, the integrated circuit system 900 includes test pads 912.

The top plan view depicts one of the test pads 912. Each of the test pads 912 can include a plurality of element pads 952, which are defined as portions of each of the test pads 912 that are physically and electrically separate from each other.

For illustration purposes, the element pads 952 are shown with circular shapes, although it is understood that the element pads 952 can include any shapes. For example, the element pads 952 can include shapes of a rectangle, a triangle, and an oval.

Each of the test pads 912 can include gaps 954, which are defined as spacing between the element pads 952 adjacent each other and there is no conductive material in the spacing. As a specific example, the gaps 954 can represent copper free areas of the test pads 912.

Each of the gaps 954 can include a gap width 956, which is defined as a distance from an edge of one of the element pads 952 to an edge of another of the element pads 952 that is adjacent the one of the element pads 952. The gap width 956 can include an approximate range of 1 micrometer (um) to 10 um so that the element pads 952 can be very close to each other.

It has been discovered that new improved design of the test pads 912 having the element pads 952 provides improved reliability since the conductive layers 114 of FIG. 1 formed directly on the element pads 952 protect the element pads 952 by covering upper surfaces of the element pads 952 thereby eliminating oxidation in package assembly process with temperature excursion.

It has also been discovered that the element pads 952 having the gaps 954 solves the root cause of the problem of exposed pad issues at the initial point and ease the process control printing coverage since it is not clear how the printing coverage is controlled.

It has further been discovered that the test pads 912 provide reduced horizontal profile without additional silicon area to ensure proper probing because a planar surface area of each of the test pads 912 is smaller than a planar surface area of a conventional test pad, shown with a dash rectangle, since a boundary of each of the test pads 912 is within an original boundary of a conventional test pad.

Figure 10:
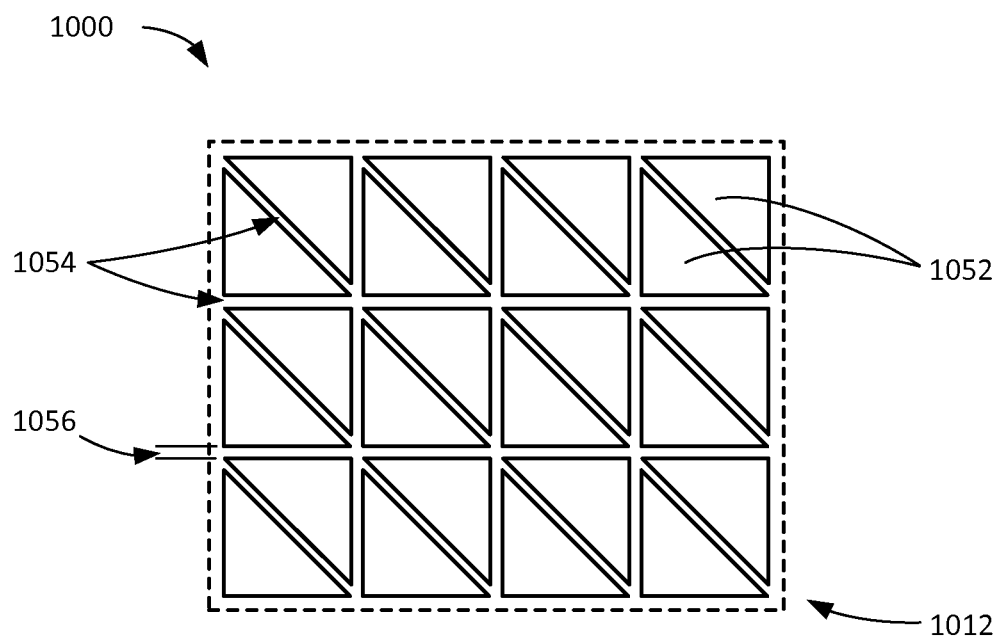
FIG. 10 is a top plan view of a portion of an integrated circuit system in a fourth embodiment of the present invention.

Referring now to FIG. 10, therein is shown a top plan view of a portion of an integrated circuit system 1000 in a fourth embodiment of the present invention. In a manner similar to the integrated circuit system 100 of FIG. 1, the integrated circuit system 1000 includes test pads 1012.

The top plan view depicts one of the test pads 1012. Each of the test pads 1012 can include a plurality of element pads 1052, which are defined as portions of each of the test pads 1012 that are physically and electrically separate from each other.

For illustration purposes, the element pads 1052 are shown with triangular shapes, although it is understood that the element pads 1052 can include any shapes. For example, the element pads 1052 can include shapes of a rectangle, a circle, and an oval. Also for example, the element pads 1052 can include a shape of a right triangle.

Each of the test pads 1012 can include gaps 1054, which are defined as spacing between the element pads 1052 adjacent each other and there is no conductive material in the spacing. As a specific example, the gaps 1054 can represent copper free areas of the test pads 1012.

Each of the gaps 1054 can include a gap width 1056, which is defined as a distance from an edge of one of the element pads 1052 to an edge of another of the element pads 1052 that is adjacent the one of the element pads 1052. The gap width 1056 can include an approximate range of 1 micrometer (um) to 10 um so that the element pads 1052 can be very close to each other.

It has been discovered that new improved design of the test pads 1012 having the element pads 1052 provides improved reliability since the conductive layers 114 of FIG. 1 formed directly on the element pads 1052 protect the element pads 1052 by covering upper surfaces of the element pads 1052 thereby eliminating oxidation in package assembly process with temperature excursion.

It has also been discovered that the element pads 1052 having the gaps 1054 solves the root cause of the problem of exposed pad issues at the initial point and ease the process control printing coverage since it is not clear how the printing coverage is controlled.

It has further been discovered that the test pads 1012 provide reduced horizontal profile without additional silicon area required to ensure proper probing because a planar surface area of each of the test pads 1012 is smaller than a planar surface area of a conventional test pad, shown with a dash rectangle, since a boundary of each of the test pads 1012 is within an original boundary of a conventional test pad.

Figure 11:
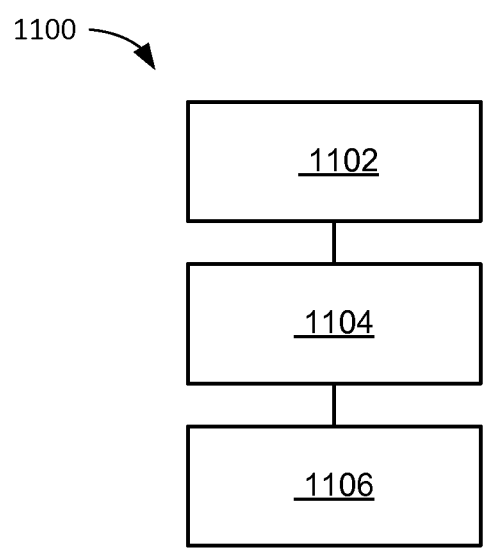
FIG. 11 is a flow chart of a method of manufacture of the integrated circuit system in a further embodiment of the present invention.

Referring now to FIG. 11, therein is shown a flow chart of a method 1100 of manufacture of the integrated circuit system 100 in a further embodiment of the present invention. The method 1100 includes: providing a substrate having a test pad with element pads in a block 1102; forming a conductive layer over the test pad, the conductive layer having element layers directly on the element pads in a block 1104; and mounting an integrated circuit over the substrate in a block 1106.

Thus, it has been discovered that the integrated circuit system of the present invention furnishes important and heretofore unknown and unavailable solutions, capabilities, and functional aspects for an integrated circuit system with pads. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a substrate having a test pad with a gap between element pads, the element pads having top surfaces and non-horizontal surfaces intersecting the top surfaces;
   forming a conductive layer over the test pad, the conductive layer having element layers directly on the top surfaces and portions of the non-horizontal surfaces; and
   mounting an integrated circuit over the substrate.

2. The method as claimed in claim 1 wherein forming the conductive layer includes forming the conductive layer having a bridge connected to one of the element layers and another of the element layers.

3. The method as claimed in claim 1 wherein providing the substrate includes providing the substrate having the element pads with rectangular shapes.

4. The method as claimed in claim 1 wherein providing the substrate includes providing the substrate having the element pads with circular shapes.

5. The method as claimed in claim 1 wherein providing the substrate includes providing the substrate having the element pads with triangular shapes.

6. A method of manufacture of an integrated circuit system comprising:
provising a substrate having a test pad with a gap between element pads, the element pads having top surfaces and non-horizontal surfaces intersecting the top surfaces;
forming a conductive layer over the test pad, the conductive layer having element layers directly on the top surfaces and portions of the non-horizontal surfaces;
mounting an integrated circuit over the substrate; and
attaching a system connector to the substrate.

7. The method as claimed in claim 6 wherein forming the conductive layer includes forming the conductive layer having a bridge connected to one of the element layers and another of the element layers, the bridge directly over the gap.

8. The method as claimed in claim 6 wherein providing the substrate includes providing the substrate having an area array of the element pads with rectangular shapes.

9. The method as claimed in claim 6 wherein providing the substrate includes providing the substrate having the gap between the element pads with circular shapes.

10. The method as claimed in claim 6 wherein providing the substrate includes providing the substrate having the element pads with shapes of a right triangle.

11. An integrated circuit system comprising:
a substrate having a test pad with a gap between element pads, the element pads having top surfaces and non-horizontal surfaces intersecting the top surfaces;
a conductive layer over the test pad, the conductive layer having element layers directly on the top surfaces and portions of the non-horizontal surfaces; and
an integrated circuit over the substrate.

12. The system as claimed in claim 11 wherein the conductive layer includes a bridge connected to one of the element layers and another of the element layers.

13. The system as claimed in claim 11 wherein the substrate includes the element pads with rectangular shapes.

14. The system as claimed in claim 11 wherein the substrate includes the element pads with circular shapes.

15. The system as claimed in claim 11 wherein the substrate includes the element pads with triangular shapes.

16. The system as claimed in claim 11 further comprising a system connector attached to the substrate.

17. The system as claimed in claim 16 wherein the conductive layer includes a bridge connected to one of the element layers and another of the element layers, the bridge directly over the gap.

18. The system as claimed in claim 16 wherein the substrate includes an area array of the element pads with rectangular shapes.

19. The system as claimed in claim 16 wherein the substrate includes the gap between the element pads with circular shapes.

20. The system as claimed in claim 16 wherein the substrate includes the element pads with shapes of a right triangle.

* * * * *